United States Patent [19]
Pramanick et al.

[11] Patent Number: 6,143,650
[45] Date of Patent: Nov. 7, 2000

[54] SEMICONDUCTOR INTERCONNECT INTERFACE PROCESSING BY PULSE LASER ANNEAL

[75] Inventors: Shekhar Pramanick, Fremont; Dirk Brown, Santa Clara; Takeshi Nogami, Sunnyvale, all of Calif.

[73] Assignee: Advanced Micro Devices, Inc., Sunnyvale, Calif.

[21] Appl. No.: 09/229,590

[22] Filed: Jan. 13, 1999

[51] Int. Cl.[7] .............................................. H01L 21/4763
[52] U.S. Cl. .......................................... 438/643; 438/643
[58] Field of Search ................... 483/643, 637, 483/638, 640, 672, 308, 378

[56] References Cited

U.S. PATENT DOCUMENTS

| | | | |
|---|---|---|---|
| 5,543,357 | 8/1996 | Yamada et al. | 438/643 |
| 5,893,752 | 4/1999 | Zhang et al. | 438/678 |
| 5,913,147 | 5/1999 | Dubin et al. | 438/687 |
| 5,994,775 | 11/1999 | Zhao et al. | 438/643 |
| 6,015,749 | 1/2000 | Lui et al. | 438/628 |

*Primary Examiner*—David Nelms
*Assistant Examiner*—Dung A Le
*Attorney, Agent, or Firm*—Mikio Ishimaru

[57] ABSTRACT

A method is provided for forming tantalum/copper barrier/seed layers in semiconductor channels or vias by using a pulsed laser annealing step. The pulsed laser can be controlled to heat the copper seed material for such short periods of time that the copper seed material does not agglomerate but the temperature is high enough to form an intermixed layer with the tantalum.

12 Claims, 2 Drawing Sheets

6,143,650

SEMICONDUCTOR INTERCONNECT INTERFACE PROCESSING BY PULSE LASER ANNEAL

TECHNICAL FIELD

The present invention relates generally to semiconductors and more specifically to processing barrier/seed materials used in semiconductors.

BACKGROUND ART

In the manufacturing of integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

In one connection process, which is called a "dual damascene" technique, two channels of conductive materials, are positioned in vertically separated planes perpendicular to each other and interconnected by a vertical "via" at their closest point.

The first channel part of the dual damascene process starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a thin barrier layer is deposited to line the walls of the first channel opening. This barrier layer acts as a barrier to prevent diffusion of subsequently deposited conductive material into the oxide layer and the semiconductor devices. It also ensures good adhesion and electrical contact of subsequent layers to the underlying semiconductor devices while improving the formation of subsequently deposited conductive material. A seed layer is then deposited on the barrier layer to act as the "seed" for subsequent deposition of the conductive material. A first conductive material is then deposited on the seed layer to fill the channels and vias. The adhesion/barrier layer, the seed layer, and the conductive material are subjected to a chemical-mechanical polishing process which removes the layers and material above the first channel oxide layer and damascenes the first conductive material in the first channel openings to form the first channels.

The via formation step of the dual damascene process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the vias.

The damascene photoresist is then removed, and a nitride etch process removes the nitride above the first channels in the via areas. A barrier layer is then deposited to line the vias and the second channel openings. This is followed by a deposition of the seed layer and then the second conductive material in the second channel openings and the vias to form the second channel and the via. A second chemical-mechanical polishing process leaves the two vertically separated, horizontally perpendicular channels connected by cylindrical vias.

The use of the dual damascene technique eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxides. When copper diffuses through dielectrics, it can cause damage to neighboring devices on the semiconductor substrate. To prevent diffusion, materials such as tantalum (Ta), titanium (Ti), and tungsten (W), their alloys or combinations thereof are used as barrier materials for copper.

In vias, copper also has the drawback that it is subject to electro-migration, or movement of copper atoms under the influence of current flow, which can cause voids in the copper. To prevent this, barrier materials are disposed at the bottom of vias above the conductive channels.

A problem associated with the interface between the barrier layer and the copper seed layer is the difficulty bonding the two layers. For example, to provide the excellent bonding of the two layers by intermixing, the two layers must be heated above 400° C. Unfortunately, copper tends to clump, or agglomerate, at temperatures above 400° C. which means that the optimal bonding temperatures can not be used.

The copper seed layers for copper interconnect in a damascene process are typically deposited by physical vapor deposition (PVD) or derivatives of PVD techniques on top of the barrier materials. The preferred method of deposition is by low temperature chemical vapor deposition specifically because of the agglomeration problem.

A solution, which would permit the formation of an intermixed layer has been long sought, but has eluded those skilled in the art. As the semiconductor industry is moving from aluminum to copper and other type of materials with greater electrical conductivity and thinner channels and vias, it is becoming more pressing that a solution be found.

DISCLOSURE OF THE INVENTION

The present invention provides a method for forming barrier/seed layers in semiconductor channels or vias by using a pulsed laser annealing step. The pulsed laser can be controlled to heat the seed material for such short periods of time that the seed material does not agglomerate but the temperature is high enough to form an intermix layer with the barrier material.

The present invention provides a method for forming tantalum/copper barrier/seed layers in semiconductor channels or vias by using a pulsed laser annealing step. The pulsed laser can be controlled to heat the copper seed material for such short periods of time that the copper seed material does not agglomerate but the temperature is high enough to form an intermix layer with the tantalum.

The present invention still further provides a method for forming barrier/seed layers in semiconductor channels or vias with improved adhesion and diffusion suppression.

BEST MODE FOR CARRYING OUT THE INVENTION

Figure 1:
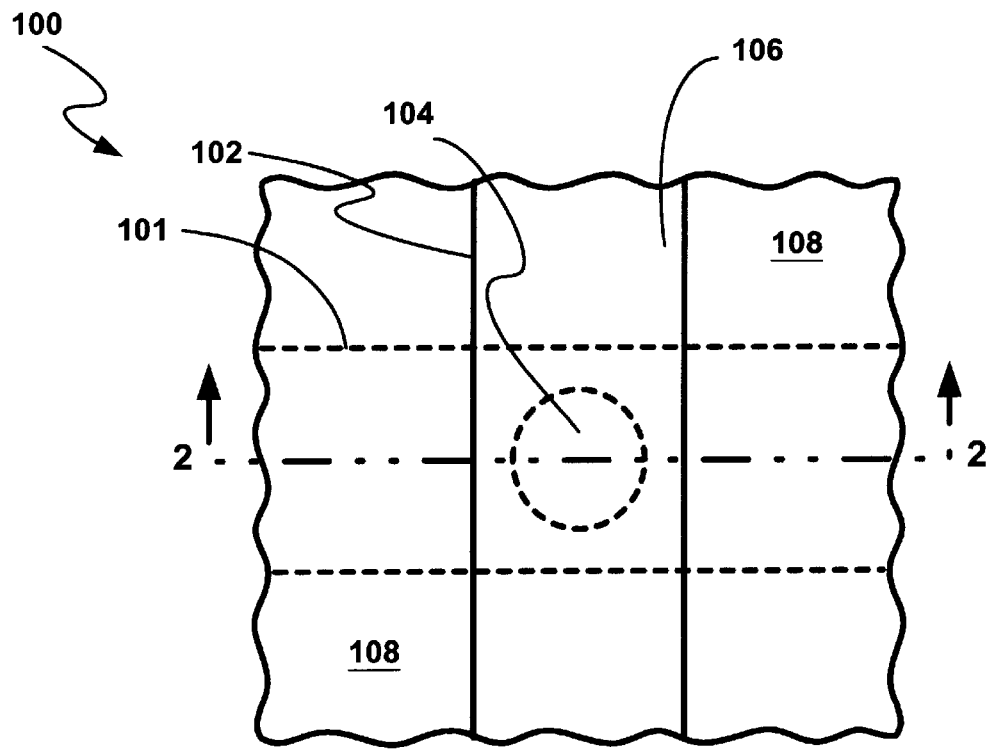
FIG. 1 (PRIOR ART) is a plan view of aligned channels with a prior art via.

Referring now to FIG. 1 (PRIOR ART), therein is shown a plan view of a prior art pair of perpendicularly aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel comprises a first conductive material. The second channel 102 is formed by filling a second channel opening 106 disposed in a second channel oxide layer 108 with a second conductive material. The second channel opening 106 is defined by walls (sidewalls) 109 of second oxide layer 108.

Figure 2:
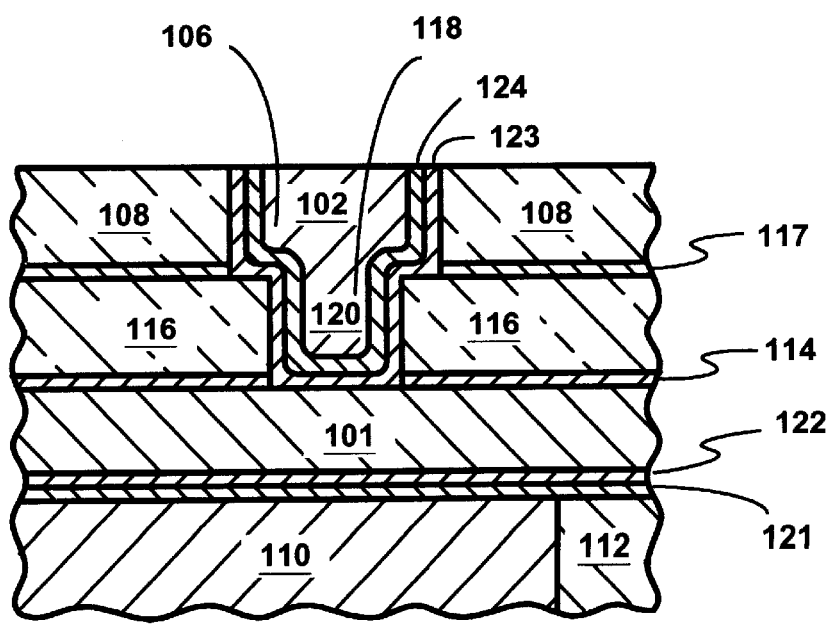
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along 2—2. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1 (PRIOR ART) defines a cylindrical via 120 when it is filled with the second conductive material.

Also shown disposed around the first channel 101 are a barrier layer 121 and seed layer 122, and around the second channel 102 and the cylindrical via 120 is a barrier layer 123 and seed layer 124. The barrier layers 121 and 123 are made up of barrier materials such as tantalum, titanium, tungsten, their alloys, compounds thereof (especially the nitrides), and combinations thereof for copper seed layers and copper or copper alloy conductive materials.

Figure 3:
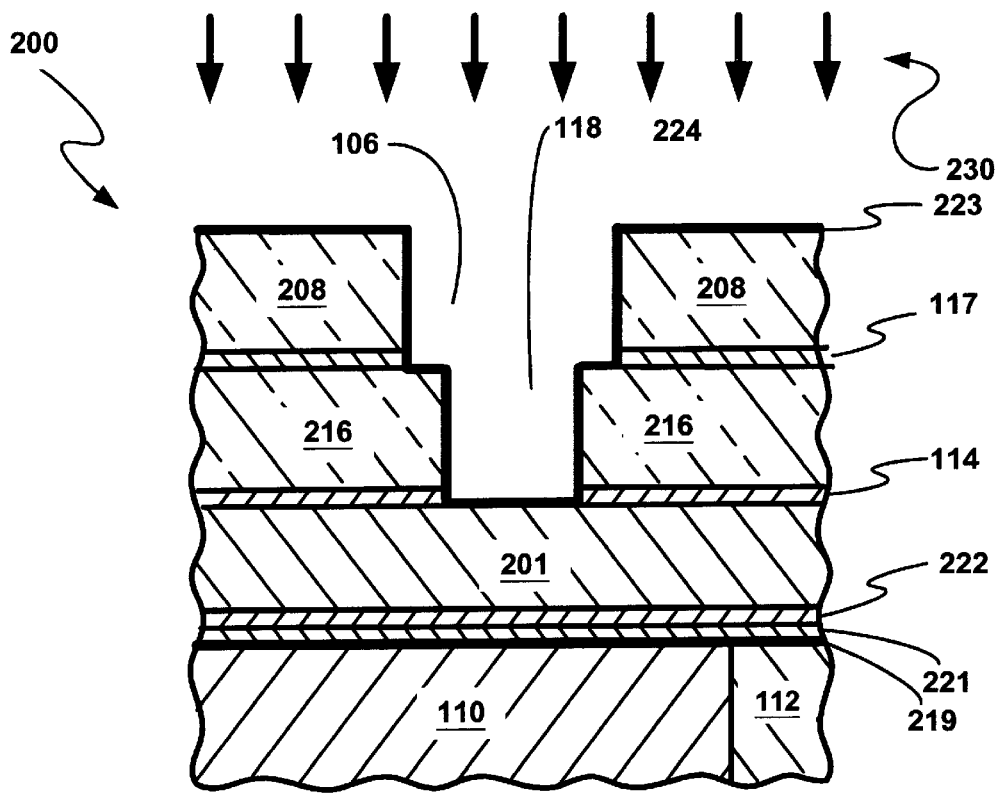
FIG. 3 is a simplified cross-section of a semiconductor wafer during the laser pulse annealing step.

Referring to FIG. 3, therein is shown the cross-section of a semiconductor wafer 200 with a pair of perpendicularly aligned semiconductor channels, disposed over a silicon substrate 110 formed in accordance with the present invention. For convenience of illustration, like reference numerals are used in FIG. 3 to denote like elements already described in FIG. 1 (PRIOR ART) and FIG. 2 (PRIOR ART). A first channel 201 of copper or copper alloy is disposed over a barrier layer 221 and a seed layer 222.

A barrier layer 223 of tantalum lines a second channel opening 202 and a via opening 220. Lining the barrier layer 223 is a seed layer 224. The arrows 230 represent the excimer laser pulses which are used to anneal the seed layer 224.

Figure 4:
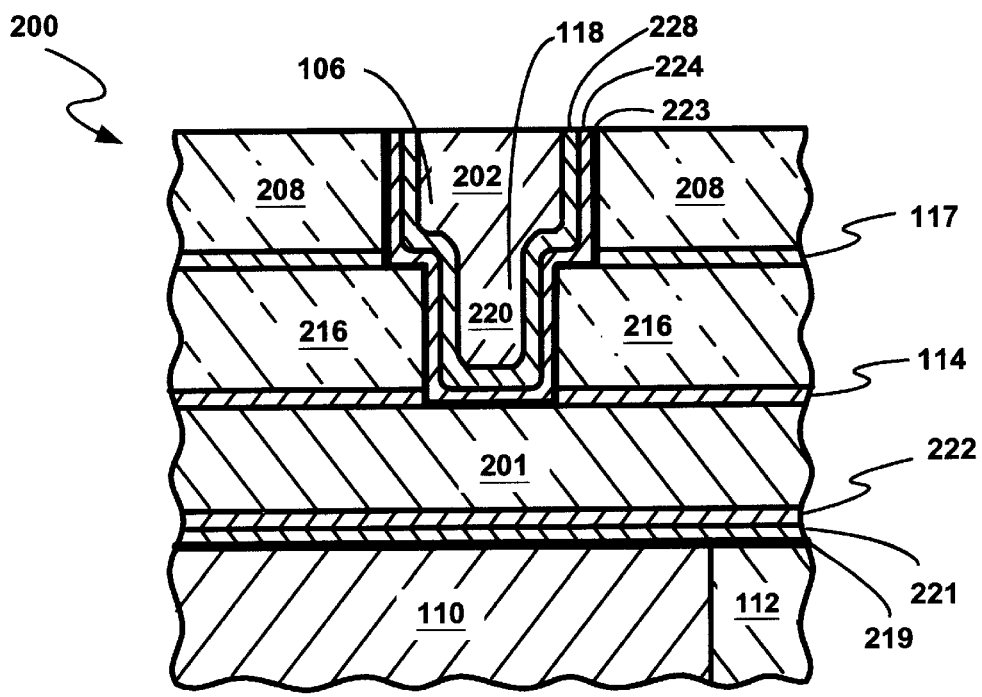
FIG. 4 is a simplified cross-section after completion of the channel.

Referring now to FIG. 4, therein is shown a cross-section of the semiconductor wafer 200 after chemical-mechanical polishing down to the dielectric layer 108.

In production, a conventional first damascene process is used to dispose a first channel 201 in a first channel oxide layer (not shown) above portions of a semiconductor device (not shown) on a production semiconductor wafer 200. The damascene process is a photolithographic process which uses a mask to define a first channel opening (not shown) in the first channel oxide layer. The first channel opening is then filled with a adhesion/barrier layer and a seed layer. The adhesion/barrier layer is then laser annealed, as will hereinafter be described in more detail, and a first conductive material, such as copper, is deposited using conventional metal deposition techniques, such as physical vapor deposition, chemical vapor deposition, electroplating, or a combination thereof, to form the first channel 201. The stop nitride layer 114, the via oxide layer 116, and the via nitride layer 117 would be successively deposited on top of the first channel 201 and the first channel oxide layer using conventional deposition techniques.

By using the via photoresist and the via photolithographic process followed by nitride etching of a round via 104 in the via nitride layer 117, the basis for the cylindrical via 118 was formed. The subsequent deposition of the second channel oxide layer 108 prepared the way for the second channel 106 to be perpendicular to the first channel 201.

The second damascene process uses a filter mask to define the second channel opening 106 in the second channel oxide layer 108. Since the second damascene process uses an anisotropic oxide etch, the etch also forms the cylindrical via 118 down to the stop nitride layer 114. The anisotropic oxide etch etches faster in the vertical direction of FIG. 3 than in the horizontal direction. The nitride etch of the stop nitride layer 114 exposes a portion of the first channel 201 and completes the etching steps.

Next, a thin adhesion/barrier layer (not shown) is deposited to line the second channel opening 106 and the cylindrical via 118, including along the walls of the second channel opening 106 and the cylindrical via 118.

Thereafter, a thin seed layer 224 is deposited to line the adhesion/barrier layer in the second channel opening 106 and the cylindrical via 118. Examples of suitable seed materials include copper and copper alloys. The seed layer 224 is deposited using conventional deposition techniques, such as physical vapor deposition, chemical vapor deposition, or a combination thereof The deposition of the seed layer 224 is followed by a laser anneal technique in accordance with the present invention. The technique can use an Excimer or Nd-YAG pulse laser which allows the copper of the seed layer 224 and the tantalum of the adhesion/barrier layer to be heated above 400° C. for long enough for a thin intermixed layer of copper and tantalum to form. At the same time, the copper is not heated long enough for agglomeration to occur. By controlling the pulses, which are hundredths of nanoseconds in duration, the copper and the tantalum can form an intermixed layer. For current technology, the adhesion/barrier layer would be between 10 to 50 nm thick, the seed layer would be between 70 to 200 nm, the intermixed layer at 400° C. or above for heating durations between 10 to 1,000 nanoseconds would be about 30 angstroms thick which is ideal for adhesion.

Next, the second conductive material is deposited into second channel opening 106 and via 118 using conventional metal deposition techniques, such as physical vapor deposition, chemical vapor deposition, electroplating, or a combination thereof. Thereafter, a chemical-mechanical polishing process is used to complete the conventional interconnect process similar to what were shown and described in FIG. 1 and FIG. 2.

Accordingly, by using laser pulse anneal of the copper/tantalum interface, high enough temperatures can be reached for optimal adhesion while avoiding agglomeration of the copper.

While the best mode utilizes copper as the conductive material, it should be understood that the present invention is applicable to other conductive materials such as copper, aluminum, silver, gold, alloys thereof, compounds thereof, and combinations thereof Similarly, the adhesion/barrier layer is can be of tantalum, titanium, tungsten, alloys thereof, compounds thereof (especially nitrides), and combinations thereof.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device, comprising the steps of:

provide a semiconductor with a dielectric layer formed thereon;

forming an opening in said dielectric layer, said opening defined by walls of said dielectric layer;

forming an adhesion/barrier layer to line said dielectric layer in said opening;

forming a seed layer to line said adhesion/barrier layer; and laser annealing said seed layer whereby said seed layer and adhesion/barrier layer intermix.

2. The method as claimed in claim 1 wherein the step of laser annealing raises the temperature of said seed layer sufficiently to cause intermixing and insufficiently to cause agglomeration.

3. The method as claimed in claim 1 wherein the step of laser annealing raises the temperature of said seed layer to 400° C. and above for between 10 to 1,000 nanoseconds.

4. The method as claimed in claim 1 wherein the step of laser annealing uses a pulse laser with pulse durations of from 1 to 100 nanoseconds.

5. The method as claimed in claim 1 wherein the step forming said adhesion/barrier layer uses a material selected from a group consisting of tantalum, titanium, tungsten, alloys thereof, compounds thereof, and combinations thereof.

6. The method as claimed in claim 1 wherein the step of forming said seed layer uses a material selected from a group consisting of copper, aluminum, silver, gold, alloys thereof, compounds thereof, and combinations thereof.

7. The method as claimed in claim 1 including the step of forming a conductive layer over said seed layer; and said step of forming a conductive layer uses a material selected from a group consisting of copper, aluminum, silver, gold, alloys thereof, compounds thereof, and combinations thereof.

8. A method of manufacturing a semiconductor device, comprising the steps of:

providing a semiconductor with a dielectric layer formed thereon;

forming an opening in said dielectric layer, said opening defined by walls of said dielectric layer;

depositing a tantalum layer to line said dielectric layer in said opening; depositing a copper layer to line said tantalum layer; and laser annealing said copper layer whereby said copper layer and tantalum layer intermix.

9. The method as claimed in claim 8 wherein the step of laser annealing raises the temperature of said copper layer sufficiently to cause intermixing and insufficiently to cause agglomeration.

10. The method as claimed in claim 8 wherein the step of laser annealing raises the temperature of said copper layer to about 400° C. and above for between 10 to 1,000 nanoseconds.

11. The method as claimed in claim 8 wherein the step of laser annealing uses a pulse laser with pulse durations of from 1 to 100 nanoseconds.

12. The method as claimed in claim 8 including the step of forming a conductive layer over said copper layer; and said step of forming a conductive layer uses a material selected from a group consisting of copper, aluminum, silver, gold, alloys thereof, compounds thereof, and combinations thereof.

* * * * *

UNITED STATES PATENT AND TRADEMARK OFFICE
CERTIFICATE OF CORRECTION

PATENT NO.    : 6,143,650
DATED         : November 7, 2000
INVENTOR(S)   : Shekhar Pramanick, et al Page 1 of 1

It is certified that error appears in the above-identified patent and that said Letters Patent is hereby corrected as shown below:

Col 4, line 25 delete "filter"

insert -- further --

Signed and Sealed this

Fifth Day of June, 2001

Attest:

Attesting Officer

NICHOLAS P. GODICI

*Acting Director of the United States Patent and Trademark Office*